United States Patent
Fonash et al.

(10) Patent No.: US 6,531,193 B2
(45) Date of Patent: *Mar. 11, 2003

(54) LOW TEMPERATURE, HIGH QUALITY SILICON DIOXIDE THIN FILMS DEPOSITED USING TETRAMETHYLSILANE (TMS) FOR STRESS CONTROL AND COVERAGE APPLICATIONS

(75) Inventors: Stephen J. Fonash, State College, PA (US); Xin Lin, Chandler, AZ (US); Douglas M. Reber, Austin, TX (US)

(73) Assignee: The Penn State Research Foundation, University Park, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/734,232

(22) Filed: Dec. 11, 2000

(65) Prior Publication Data

US 2002/0094388 A1 Jul. 18, 2002

Related U.S. Application Data

(63) Continuation-in-part of application No. 09/110,923, filed on Jul. 6, 1998, now Pat. No. 6,159,559
(60) Provisional application No. 60/051,823, filed on Jul. 7, 1997.

(51) Int. Cl.$^7$ .............................................. C23C 16/40
(52) U.S. Cl. ...................... 427/579; 427/162; 427/167; 427/255.37
(58) Field of Search ................................ 427/563, 579, 427/162, 167, 255.37

(56) References Cited

U.S. PATENT DOCUMENTS

| | | | |
|---|---|---|---|
| 4,981,724 A | | 1/1991 | Hochberg et al. ......... 427/255.3 |
| 5,094,879 A | * | 3/1992 | Matsuda et al. ....... 427/255.26 |
| 5,168,343 A | | 12/1992 | Sakamoto ................... 257/513 |
| 5,227,196 A | | 7/1993 | Itoh .......................... 427/249 |
| 5,314,724 A | | 5/1994 | Tsukune et al. ............. 427/489 |
| 5,487,875 A | | 1/1996 | Suzuki .................. 422/186.05 |
| 5,532,191 A | | 7/1996 | Nakano et al. .............. 437/228 |
| 5,538,699 A | | 7/1996 | Suzuki .................. 422/186.29 |
| 5,541,003 A | | 7/1996 | Nakayama et al. ......... 428/408 |
| 5,565,247 A | | 10/1996 | Suzuki ....................... 427/562 |
| 5,591,486 A | * | 1/1997 | Okano et al. ........ 148/DIG. 50 |
| 5,593,741 A | | 1/1997 | Ikeda ......................... 427/579 |
| 5,621,750 A | | 4/1997 | Iwano et al. ................... 372/96 |
| 5,646,050 A | | 7/1997 | Li et al. .......................... 437/4 |
| 5,658,389 A | | 8/1997 | Matsuda et al. ............. 118/723 |
| 5,677,236 A | | 10/1997 | Saitoh et al. ................ 437/109 |
| 5,916,365 A | | 6/1999 | Sherman ..................... 117/92 |
| 5,942,049 A | | 8/1999 | Li et al. ...................... 136/258 |
| 5,985,091 A | | 11/1999 | Suzuki ....................... 156/345 |
| 5,994,756 A | | 11/1999 | Umezawa et al. .......... 257/510 |
| 5,998,303 A | | 12/1999 | Sato ........................... 438/758 |
| 6,001,431 A | | 12/1999 | Itoh et al. ................... 427/569 |
| 6,159,559 A | * | 12/2000 | Reber et al. ................ 427/162 |
| 6,159,871 A | | 12/2000 | Loboda et al. .............. 438/786 |

FOREIGN PATENT DOCUMENTS

| | | | |
|---|---|---|---|
| EP | 387403 | 9/1990 | .......... C23C/16/40 |
| EP | 519079 | 12/1992 | ......... H01L/21/312 |
| EP | 603821 | 6/1994 | .............. B41J/2/16 |
| EP | 651385 | 5/1995 | .......... G11B/15/28 |
| EP | 729190 | 8/1996 | ......... H01L/31/376 |
| EP | 764969 | 3/1997 | ............ H01J/37/32 |
| EP | 776036 | 5/1997 | ......... H01L/21/762 |
| EP | 880164 | 11/1998 | ............ H01J/37/32 |
| EP | 881668 | 12/1998 | ......... H01L/21/312 |
| EP | 960958 | 12/1999 | .......... C23C/16/30 |
| EP | 997927 | 5/2000 | ............ H01J/37/32 |
| EP | 1050600 | 11/2000 | .......... C23C/16/40 |
| EP | 1050601 | 11/2000 | .......... C23C/16/40 |
| WO | WO 95/20254 | 7/1995 | ............. H01S/3/85 |
| WO | WO 95/26571 | 10/1995 | .......... H01L/31/06 |
| WO | WO 99/02276 | 1/1999 | ............ B05D/3/06 |
| WO | WO 00/61833 | 10/2000 | .......... C23C/16/50 |

OTHER PUBLICATIONS

Reber et al. "Low temperature, high quality silicon dioxide thin films deposited using tetramethylsilane," *Mat. Res. Soc.* Conference Paper. 1998.

Hozumi et al. "Preparation of silicon oxide films having a waer–repellent layer by multiple–step microwave plasma–enhanced chemical vapor deposition." *Thin Solid Films.* vol. 334, No. 1–2, p. 54–9. Dec. 4, 1998.

Hozumi et al. "Effect of ultraviolet irradiation on silicon oxide films prepared by radio frequency plasma–enhanced chemical vapor deposition." *Journal of the Electrochemical Society.* vol. 144, No.8, p. 2824–8. Aug. 1997.

Hozumi et al. "Effects of methyl and perfluoro–alkyl groups on water repellency of silicon oxide films prepared by microwave plasma–enhanced chemical vapor deposition." *Japanese Journal of Applied Physics.* vol. 36, No. 7B, p. 4959–63. Jul. 1997.

Moore et al. "Ultrathin silicon oxide films deposited by synchrotron irradiation of condensed layers of silanes and water." *Thin Solid Films.* vol. 280, No. 1–2, p. 101–6. Jul. 1996.

\* cited by examiner

*Primary Examiner*—Timothy Meeks
(74) *Attorney, Agent, or Firm*—Ohlandt, Greeley, Ruggiero & Perle, L.L.P.

(57) ABSTRACT

Silicon dioxide thin film have been deposited at temperatures from 25° C. to 250° C. by plasma enhanced chemical vapor deposition (PECVD) using tetramethylsilane (TMS) as the silicon containing precursor. At these temperatures, the PETMS oxide films have been found to exhibit adjustable stress and adjustable conformality. Post deposition annealing in forming gas at or below the deposition temperatures has been shown to be very effective in improving the PETMS oxide properties while preserving the low temperature aspect of the PETMS oxides.

27 Claims, 16 Drawing Sheets

LOW TEMPERATURE, HIGH QUALITY SILICON DIOXIDE THIN FILMS DEPOSITED USING TETRAMETHYLSILANE (TMS) FOR STRESS CONTROL AND COVERAGE APPLICATIONS

This application is a continuation-in-part of U.S. Ser. No. 09/110,923, filed Jul. 6, 1998, now U.S. Pat. No. 6,159,559, and Provisional Application No. 60/051,823 filed Jul. 7, 1997, the contents of all are hereby incorporated by reference into this application.

U.S. Ser. No. 09/110,923, filed Jul. 6, 1998 was made with United States Government support under a grant by DARPA under contract #F33615-94-1-1464. Accordingly, the U.S. Government has certain rights in the invention.

FIELD OF THE INVENTION

This invention relates to a method and apparatus for the deposition of oxide films and, more particularly, to an improved low temperature, chemical vapor deposition method for the deposition of silicon dioxide films.

BACKGROUND OF THE INVENTION

Low temperature chemical vapor deposited silicon dioxide has found extensive use in microelectronic applications as gate dielectrics in the metal-oxide-semiconductor field-effect transistor (MOSFET) devices, passivation layers, interlayer insulators, and as protection masks to pattern and expose some regions for processing while shielding other areas. In addition, amorphous silicon oxides are routinely used in large area electronics and opto-electronics such as in displays, optical interconnects, and solar photovoltaic cells. In many of these devices, there is a need to reduce the oxide film deposition temperatures while retaining overall uniformity, homogeneity and dielectric quality. For example, in displays and solar cells, commonly employed low temperature glass substrates limit the maximum oxide processing temperature to about 600° C. For dielectrics used between metals in integrated circuit (IC) manufacturing, the deposition temperature must be below 450° C. to prevent the aluminum in the conductor lines from reacting with the silicon. In addition, high quality oxides deposited at a temperature below 200° C. would be highly useful to the optical coatings industry and could also help bring about the use of plastic substrates for microelectronic devices. Therefore, great effort has been devoted to the reduction of the deposition temperature necessary for high quality silicon dioxide film growth.

The deposition of high quality silicon dioxide films at temperatures below 400° C. has, to date, been dominated by oxidizing plasma-enhanced chemical vapor deposition (PECVD) reactions which use tetraethyloxysilane (TEOS) or silane ($SiH_4$) as the silicon precursor source. These low temperature oxides have not only been used for thin film transistor (TFT) device fabrication (see D. Buchanan et al., IEEE Electron Device Letters, V. 9, p. 576 (1988)), but are also commonly employed as intermetal-dielectrics and passivation layers in the microelectronics industry (see B. Chin et al., Solid State Technology, p. 119 (April 1988)).

U.S. Pat. No. 5,593,741 to Ikeda discloses the use of a chemical vapor deposition (CVD) method for the deposition of silicon oxide films through the use of TEOS and oxygen in a plasma reaction chamber (with helium as a carrier). Ikeda's process involves alternate depositions of thin oxide layers, first without a plasma and then with a plasma which provides an ion bombardment to improve the film's properties and the film's conformance to an underlying substrate. Even though the Ikeda specification quotes a range of deposition temperatures of from 200° C. to 400° C., it provides no examples to support substrate temperatures less than 300° C. In addition, in U.S. Pat. No. 5,462,899, Ikeda describes a CVD method for forming a $SiO_2$ layer using TEOS and ozone as the principal reactants. The substrate temperature (for an example using triethoxyfluorosilane) is cited as 400° C. in the specification.

Even though plasma-enhanced CVD TEOS (PETEOS) and silane-based oxides can be deposited with high quality at acceptable deposition rates, these materials do have drawbacks for these envisioned applications. For example, device quality PETEOS $SiO_2$ films are difficult to achieve at temperatures below 250° C. (see T. Itani et al., Mat. Res. Soc. Symp., 446, p. 255, (1997)). Also, TEOS has a low vapor pressure of about 2 Torr (at 25° C. and 1 atm.) which necessitates the heating of all delivery lines and chamber surfaces to avoid TEOS condensation. Such a low vapor pressure also prevents gas metering with conventional mass flow controllers (MFCs) (see S. Nguyen et al., J. Electrochem. Soc., 137, p. 2209, (July 1990)). Silane gas, conversely, is easily metered by conventional MFCs, but great care must be used because silane is a toxic and pyrophoric gas which constitutes an explosion hazard at high $SiH_4$ concentrations. Because of these issues, there continues to be interest in various non-pyrophoric organo-silicon gases with high vapor pressure as new silicon source materials for PECVD oxide applications.

In the examples given by Ikeda in U.S Pat. No. 5,593,741, besides TEOS, octamethylcyclotetrasiloxane and tris(diethylamino)silane are also used as the silicon sources. Meanwhile, Ikeda indicates that tetramethylsilane (TMS) can be used in the process in lieu of TEOS as well. However, the lowest substrate temperature cited in the specification is 300° C. In U.S. Pat. No. 5,462,899, TMS is indicated as being an alternative silicon source, where the substrate temperature was reported to be 400° C. In addition, U.S. Pat. No. 5,083,033 to Komano et al. describes the use of TMS as a reactant to produce a silicon oxide layer, using a focused ion beam to create an environment for the surface reaction. On the other hand, Guinn et al. in "Chemical Vapor Deposition of $SiO_2$ from Ozone—Organosilane Mixtures Near Atmospheric Pressure", Materials Research Symposium Proceedings, Vol 282 (1993), indicate that TEOS is 5–10 times more reactive with ozone than is TMS, in a CVD reaction chamber, within a temperature range of 258° C. to 328° C. As can be seen from the above prior art, the lowest reaction temperature in a plasma chamber used for the deposition of $SiO_2$ (where TMS is a precursor and the results are supported by experimental evidence) is about 258° C.

Accordingly, it is an objective of this invention to provide an improved method for the deposition of TMS $SiO_2$ wherein the deposition temperature is less than 250° C. Furthermore, the mechanical properties as well as the conformality of TMS oxides have not been explored in detail; thus, investigation and exploitation of these properties of TMS oxide films is another objective of this invention. Moreover, low temperature oxide films typically exhibit relatively poor properties compared with high temperature films. Post-deposition annealing often improves the quality of deposited films. However, most published studies used an annealing temperature higher than the deposition temperature, which comprised the advantage of low temperature process. In order to preserve the low temperature aspect while seeking these improvement techniques, the present inventors have demonstrated the effectiveness of post-deposition annealing treatment at or below the deposition temperature.

In addition to gate dielectrics in TFTs, oxide films can be used in other applications, such as the inter-level dielectric. Another objective of this invention is to extend the applications of PECVD TMS (PETMS) oxides to micro- and nanofabrication beyond the gate dielectric application.

SUMMARY OF THE INVENTION

The present invention is directed to a method for forming a silicon oxide film on a substrate comprising the steps of: (a) heating the substrate to a deposition temperature of between about 25° C. to 250° C.; (b) providing tetramethylsilane (TMS) in a gas flow amount up to about 1,000 sccm in a plasma discharge; (c) developing pressure between about 0.001 Torr and 100 Torr; and (d) depositing $SiO_2$ on the substrate. In one embodiment of the invention, the substrate comprises at least one of: a semiconductor, a dielectric, a conductor, a glass, a polymer, a plastic, a metal foil or combinations thereof. In another embodiment of the invention, the deposition temperature is from about 100° C. to 200° C. and the pressure of step (c) is between about 2 Torr to about 8 Torr. In a further embodiment of the invention, the TMS is provided in a gas flow amount up to about 100 sccm in a plasma discharge. In a preferred embodiment, the TMS in step (b) is the primary silicon containing precursor source and the plasma discharge of step (b) comprises oxygen atoms, radicals and ions. In an embodiment of the invention, the TMS to oxygen flow rate is present in a ratio of between about 1:10 to about 1:2000.

In one embodiment of the invention, the above described method further comprises the step of providing RF power of between about 1 W to 1000 W.

In one embodiment of the invention, the above described method further comprises a post-deposition annealing step which comprises applying a forming gas and heating the silicon oxide film to an annealing temperature at or below the deposition temperature of step (a). Preferably, the forming gas comprises hydrogen and a gas selected from the group including: argon, nitrogen, helium and mixtures thereof. In another embodiment of the invention, the leakage current through the silicon oxide film is reduced while the annealing temperature of the silicon oxide film is maintained at or below the deposition temperature of step (a). The leakage current is measured by applying a voltage across the silicon oxide film. In another embodiment of the invention, wherein the interface trap state density of the silicon oxide film is reduced while the annealing temperature of the silicon oxide film is maintained at or below the deposition temperature of step (a). In a further embodiment of the invention, the oxide charge density in the silicon oxide film is reduced while the annealing temperature of the silicon oxide film is maintained at or below the deposition temperature of step (a). In still a further embodiment of the invention, the amount of trapped charges in the oxide film as demonstrated by bi-directional dynamic capacitance-voltage (C-V) sweep is reduced while the annealing temperature of the silicon oxide film is maintained at or below the deposition temperature of step (a).

The present invention is also directed to a method for controlling the stress level of a silicon oxide film which is formed on a substrate comprising the steps of: (a) heating the substrate to a deposition temperature of between about 25° C. to 250° C.; (b) providing TMS in a gas flow amount up to about 1,000 sccm in a plasma discharge; (c) developing a pressure between about 0.001 Torr and 100 Torr; and (d) depositing $SiO_2$ on the substrate, whereby the silicon oxide film exhibits a stress level between about −1.0 GPa to 0.5 GPa. Preferably, the silicon oxide film exhibits a stress level between about −0.5 GPa to 0.12 GPa.

In one embodiment of the invention, the stress of the silicon oxide film is adjusted by varying at least one condition selected from the following: TMS flow rate, TMS:$O_2$ flow rate ratio, RF power, temperature, deposition pressure, substrate material and film thickness. In another embodiment of the invention, the silicon oxide film is adjusted by at least one of the above conditions so that the silicon oxide film exhibits zero stress or 0 GPa. In a further embodiment of the invention, wherein the above described method further comprises at least one step from the group including: decreasing the deposition temperature of step (a) and increasing the pressure of step (c), whereby the silicon oxide film exhibits tensile stress between about 0 GPa to about 0.5 GPa. In still a further embodiment of the invention, wherein the above described method further comprises at least one step from the group including: increasing the deposition temperature of step (a) and decreasing the pressure of step (c), whereby the silicon oxide film exhibits compressive stress between about −1.0 GPa to about 0 GPa.

The present invention is further directed to a method for controlling the conformality of a silicon oxide film formed on a substrate comprising the steps of: (a) heating the substrate to a deposition temperature of between about 25° C. to 250° C.; (b) providing TMS in a gas flow amount up to about 1,000 sccm in a plasma discharge; (c) developing pressure between about 0.001 Torr and 100 Torr; and (d) depositing $SiO_2$ on the substrate. In one embodiment of the invention, the conformality of the silicon oxide film is adjusted by varying at least one condition selected from the group consisting of. TMS flow rate, TMS:$O_2$ flow rate ratio, RF power, temperature, deposition pressure, substrate material and film thickness. In another embodiment of the invention, the silicon oxide film is adjusted by at least one of the above conditions so that the silicon oxide film exhibits bumps, voids or combinations thereof.

In another embodiment of the invention, the above described method for controlling the conformality of a silicon oxide film further comprises at least one step from the group consisting of: decreasing the deposition temperature of step (a) to less than about 200° C. and increasing the pressure of step (c) to above about 3 Torr, whereby the silicon oxide film exhibits conformal deposition topology on the substrate. Preferably, the deposition temperature is between about 25° C. to 200° C. and the pressure is between about 5 Torr and 100 Torr.

In a further embodiment of the invention, the above described described method for controlling the conformality of a silicon oxide film further comprises at least one step from the group including: increasing the deposition temperature of step (a) to at least 50° C. and decreasing the pressure of step (c) to below about 10 Torr, wherein the silicon oxide film exhibits non-conformal deposition topology having a void or a seam disposed between the film and the substrate or within the film. Preferably, the deposition temperature is between about 50° C. to about 250° C. and the pressure is below about 8 Torr.

EXPERIMENTAL PROCEDURE AND RESULTS

Film Deposition

Figure 1:
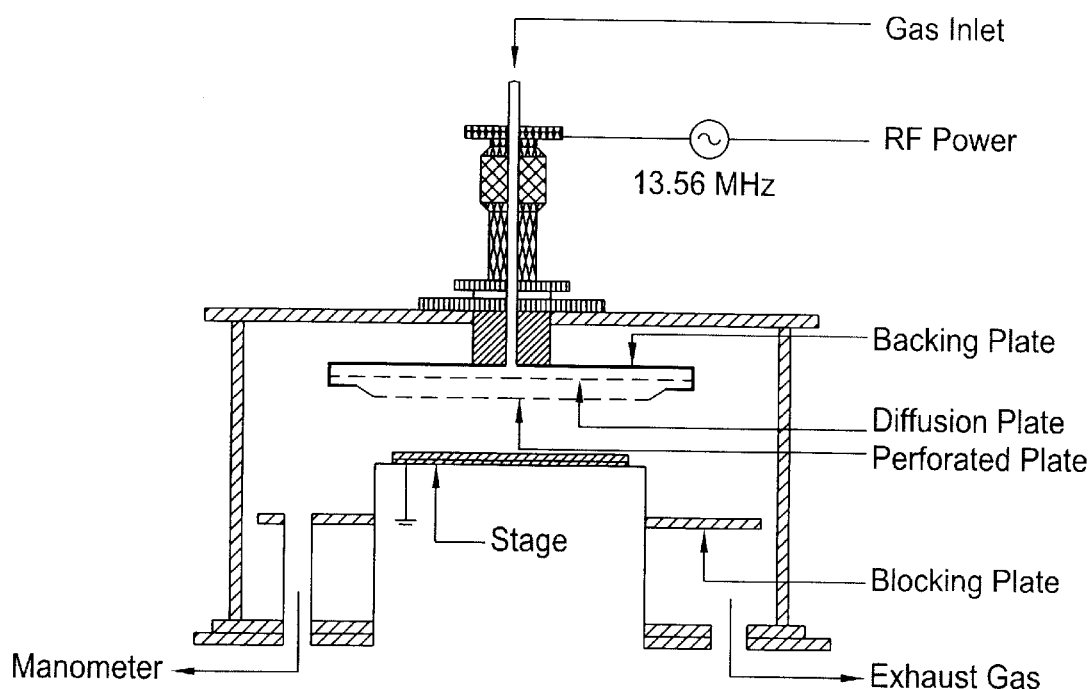
FIG. 1 is a schematic representation of a PECVD shower head configuration used to implement the method of the present invention. Aspects of the shower head configuration include: gas inlet (1), RF power (2), backing plate (3), diffusion plate (4), perforated plate (5), stage (6), manometer (7), blocking plate (8), exhaust gas port (9).

All the PETMS oxide thin films in this invention were prepared using the PECVD reactor shown in FIG. 1. Reactant gases, including ultra high purity (99.999%) oxygen and 99.9% tetramethylsilane, were mixed before being injected to the shower head. The shower head was connected to an RF power supply and functioned as one electrode of the parallel plate, capacitively coupled arrangement, while the heated sample stage was grounded, acting as another electrode. The distance between the shower head and the sample stage was adjustable and was set at 2 cm in this invention.

Three kinds of substrates were utilized for different characterization purposes: (a) (100) p-Si substrates with the thickness of 37 μm were used for the stress measurements; (b) Trenches with 500 Å pre-coated aluminum were used to evaluate the conformality of the PETMS oxides; (c) (100) p-Si substrates with resistivity of 10–20 Ω·cm were used for annealing experiments.

Samples (c) were initially cleaned in acetone, isopropyl alcohol, and deionized water with the aid of ultrasound before the native oxide was stripped in 10:1 buffered HF (BOE). When the base pressure in the PECVD chamber is lower than $5\times10^{-7}$ Torr, O$_2$ gas was introduced into the chamber via the gas dispersion shower head and a period of 5 minutes was allotted for the gas flow to stabilize. A plasma was then struck with the same RF power, pressure, and O$_2$ flow rate as would be employed in oxide deposition soon afterward. The O$_2$ plasma was sustained for 15 minutes, which not only heated up the substrates by ion bombardment and brought them to thermal equilibrium, but also helped the formation of interface oxide. Oxide deposition took place after the introduction of TMS into the deposition chamber. In order to completely oxidize TMS residues, another 15-minute O$_2$ plasma was sustained after turning off TMS.

In this invention, the substrate temperatures used were in the range of 100° C.–200° C. at 25° C. intervals. The deposition pressure was set at 2 Torr, 2.5 Torr, 3 Torr, 5 Torr, and 8 Torr. In order to obtain good quality oxide with little carbon incorporation, a low TMS flow rate and a large excess of O$_2$ are preferable. Thus, the TMS:O$_2$ flow rate ratio was chosen to be 1 sccm:500 sccm. In addition, 40 W RF power was selected in this invention to minimize the damage caused by ion bombardment with high energy.

In preparing samples for stress measurements, PETMS oxide films with a thickness of about 1500 Å were deposited on p-type (100) Si wafers. In addition, oxide films with various thickness in the range of 1500–4500 Å were deposited to study the variation of stress with the film thickness. For the evaluation of the conformality of the PETMS oxides, oxide thin films with a thickness of about 2000–3000 Å were deposited on the trenches. Furthermore, for the annealing studies, the deposition time was adjusted to obtain approximately 500 Å oxides.

Characterization Techniques

Stress-measurements

In this invention, a single-beam automated laser scanning system was employed to determine the stress in our low deposition temperature PETMS oxide thin films. The measurement was carried out prior to and after oxide film deposition to determine the curvature change caused by the deposited film. Stress in the thin films can then be calculated from the curvature delta, film thickness, substrate thickness, as well as mechanical properties of oxide film and substrate.

Cross-sectional Scanning Electron Microscopy (XSEM)

A JEOL JSM-6300FV Field Emission Scanning Electron Microscope was utilized to reveal the conformality of the deposited oxide films in the underlying trenches. Both sample surfaces and cross-sections were coated with a thin gold layer to improve sample surface electrical conductivity, resolution, and image quality.

Annealing

Metal-oxide-semiconductor (MOS) capacitors were fabricated using the deposited oxide films by high vacuum thermal evaporation of Al through a shadow mask The current-voltage (I-V) and capacitance-voltage (C-V) characteristics of as-deposited and annealed samples were measured using a Hewlett-Packard 4145B semiconductor parameter analyzer and a Kiethley KI 82 measurement system, respectively. The largest dots with area of 1 mm² were adopted in C-V measurement to ensure high enough capacitance. On the other hand, I-V dynamic sweeps were performed using the smallest dots with area of 0.073 mm². To maintain the low temperature aspect, the annealing was carried out at the deposition temperature for two hours in forming gas (4% $H_2$+96% Ar) and, for comparison, in pure Ar ambient using an AET RXV8 rapid thermal processing (RTP) system.

Experimental Results

Stress

Examination of stress in PETMS oxide films is of importance because stress in such films is critical in micro-electro-mechanical (MEMs) applications. Stress level control can also be very useful to the prediction of oxide cracking behavior, adhesion failure, and other stress-related phenomena. In this application, the measured stress $\sigma_{tot}$ in the deposited film can be calculated by way of the Stoney formula (M. Ohring, The Materials Science of Thin Films. Boston: Academic Press, 1992).

$$\sigma_{tot} = \frac{E_{sub}}{1-v_{subs}} \frac{t_{subs}^2}{6t_f}\left(\frac{1}{R_a} - \frac{1}{R_b}\right)$$

where $E_{subs}$, $v_{subs}$, and $E_{subs}/(1-v_{subs})$ are Young's modulus, Poisson's ratio, and biaxial Young's modulus of the substrate, respectively, $t_{subs}$ and $t_f$ are substrate and film thickness, respectively, $R_a$ and $R_b$ are the sample's radius of curvature after and prior to film deposition, respectively. By convention, the radius of curvature is negative for convex samples where films are under compression. In contrast, it is positive for concave samples where tensile stress exists in the films. Stress existing in thin films is contributed by two components: (a) thermal stress $\sigma_{th}$, which arises from the thermal expansion mismatch between the films and the substrates; (b) intrinsic stress $\sigma_{ins}$, which is related to the internal structure and composition and is dependent on deposition conditions and impurity content. The corresponding thermal stress can be expressed as a function of deposition temperature $T_{dep}$ (M. Ohring, The Materials Science of Thin Films. Boston: Academic Press, 1992).

$$\sigma_{th} = \left(\frac{E_f}{1-v_f}\right)(\alpha_f - \alpha_{subs})(T_{dep} - T_{mes})$$

where $E_f$, $v_f$, and $E_f/(1-v_f)$ are Young's modulus, Poisson's ratio, biaxial Young's modulus of the film, respectively, $\alpha_f$ and $\alpha_{subs}$ are thermal expansion coefficients of the film and the substrate, respectively, $T_{mes}$ is stress measurement temperature. In this work, $E_f$ and $v_f$ were approximated to be 83 GPa and 0.167 for all the PETMS oxide films considered (S. M. Hu, "Stress-related problems in silicon technology," J. Appl. Phys., vol. 70, no. 6, pp. R53–80, 1991). $\alpha_{Si}$ was reported to vary with temperature (H. Windischmann, G. Epps, Y. Cong, and R. Collins, "Intrinsic stress in diamond films prepared by microwave plasma CVD," J. Appl. Phys., vol. 69, no. 4, pp. 2231–2237, 1991), and $\alpha_{SiO2}$ was believed to be a function of temperature as well. However, given the low deposition temperatures and small temperature span employed in the experiment, $\alpha_{Si}$=2.49×10⁻⁶/° C. and $\alpha_{SiO2}$=5×10⁻⁷/° C. at room temperature were adopted to simplify the calculation. With knowledge of $\sigma_{tot}$ and $\sigma_{th}$, intrinsic stress $\sigma_{ins}$ can be calculated following the expression $$\sigma_{ins} = \sigma_{tot} - \sigma_{th}$$

Figure 2:
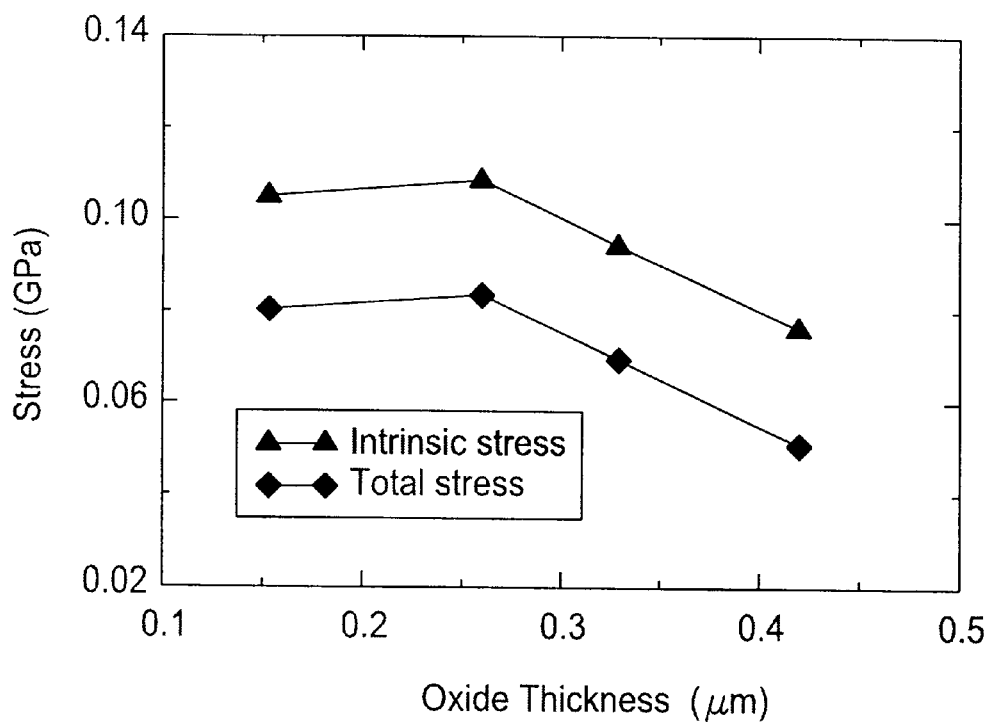
FIG. 2 is a graph showing total and intrinsic film stress as a function of film thickness where the PECVD TMS oxide films were deposited at 150° C., 3 Torr, 40 W with TMS:O$_2$ flow rates of 1 sccm: 500 sccm.

Ideally, film stress is independent on film thickness. However, thickness dependence of stress in PECVD TMS oxide films can be observed in FIG. 2, where oxide films were deposited at 150° C. and 3 Torr. As shown in FIG. 2, stress in oxide films is insensitive to film thickness when oxide film is thinner than 2500 Å. Thus, the oxide film thickness can be adjusted as necessary within this range without altering the film stress. In contrast, when film thickness is greater than 2500 Å, film stress linearly decreases with increasing oxide thickness. Such a thickness dependence of stress provides a useful knob for tuning the film stress as desired in applications where the film thickness is not strictly constrained by other technical requirements. A similar thickness dependence of film stress was reported by Naseem et al. and it was attributed to the surface reactivity of the deposited films (H. Naseem, M. Haque, and W. Brown, "Stress and bonding characterization of PECVD silicon dioxide films," in Proceedings of the Symposium on Silicon Nitride and Silicon Dioxide Thin Insulating Films (M. Deen, W. Brown, K. Sundaram, and S. Raider, eds), vol. 97–100, (Pennington, N.J.), pp. 217–231, The Electrochemical Society, 1997). As shown in FIG. 2, 1500 Å PETMS oxide film deposited at 150° C. and 3 Torr exhibits a total tensile stress of 0.08 GPa. Differential thermal expansion between Si substrate and $SiO_2$ film accounts for −0.025 GPa thermal stress, which places oxide film in compression. Therefore, the intrinsic stress of this TMS oxide film turned out to be 0.105 GPa, which is comparable with that in $SiO_2$ films obtained by thermal growth or by various CVD techniques using a variety of different precursors (C. Chang and S. Sze, ULSI Technology. New York: McGraw-Hill, 1996). It is critical to note that this excellent stress level is being obtained in a low deposition temperature process.

Figure 3:
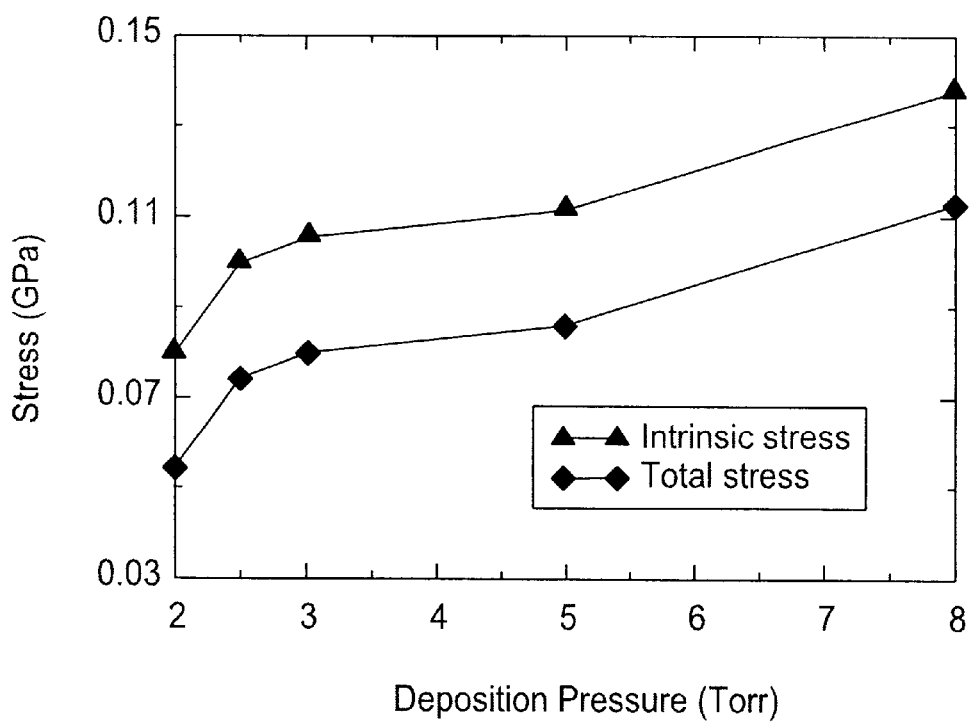
FIG. 3 is a graph showing total and intrinsic film stress as a function of deposition pressure where the PECVD TMS oxide films were deposited at 150° C., 40 W with TMS:O$_2$ flow rates of 1 sccm: 500 sccm.

FIG. 3 plots the total and intrinsic stress in PETMS oxide films as a function of deposition pressure. All the oxide films in this figure were deposited at 150° C. with a thickness of about 1500 Å. Tensile stress is observed in all the PETMS oxide films. Both the total stress and intrinsic stress increases with deposition pressure. Due to the contribution of compressive thermal stress, total stress exhibits a lower value of tensile stress than intrinsic stress. Moreover, because all the samples in FIG. 3 were prepared under the same substrate temperature, the contribution of compressive thermal stress is identical for all the samples, therefore, intrinsic stress exactly follows the increasing trend of total stress with deposition pressure.

Figure 4:
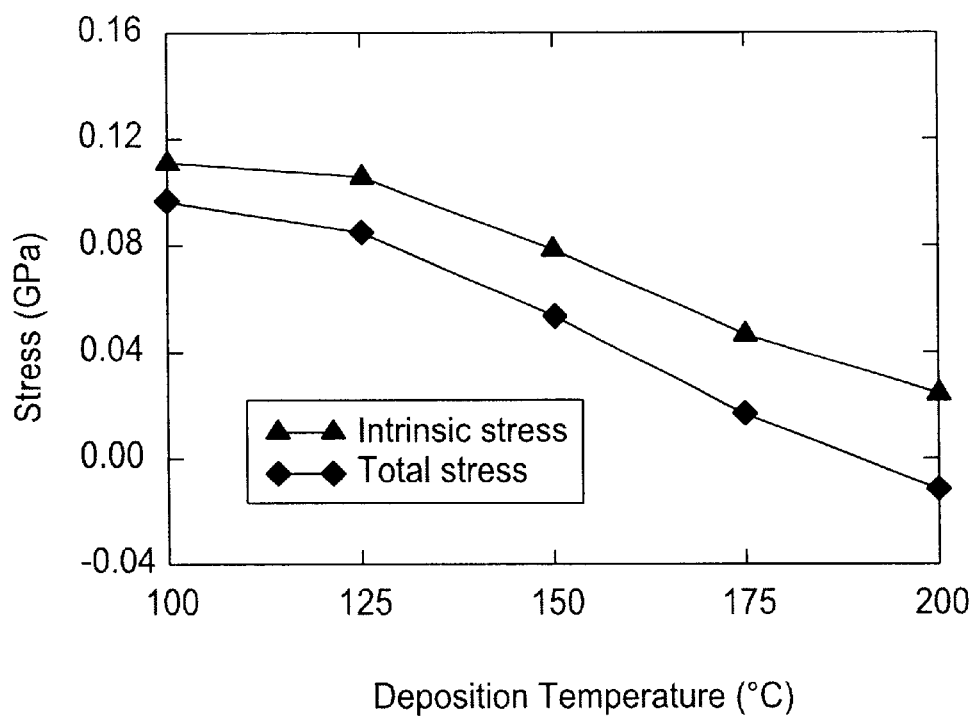
FIG. 4 is a graph showing total and intrinsic film stress as a function of substrate temperature where the PECVD TMS oxide films were deposited at 2 Torr, 40 W with TMS:O$_2$ flow rates of 1 sccm: 500 sccm

Dependence of total and intrinsic stress in PETMS oxide films on substrate temperature is shown in FIG. 4, where all the oxide films were deposited at 2 Torr with a thickness of about 1500 Å. It can be seen from the figure that both the total stress and intrinsic stress decrease with increasing substrate temperature. However, in contrast to FIG. 3, where both total stress and intrinsic stress exhibit exactly the same trend, the total stress in this case decreases faster than intrinsic stress, and a total compressive stress with a magnitude of 0.011 GPa was observed at 200° C., whereas intrinsic stress is tensile over the entire temperature range studied. As substrate temperature increases, larger differential temperature between deposition and measurement results in more negative thermal stress, which accounts for the stronger temperature dependence of total stress than intrinsic stress.

The intrinsic tensile stress in oxide films as well as the trends observed in FIG. 3 and FIG. 4 can be understood in view of film density, as well as the incorporation of hydrogen into the oxide films in the form of Si—OH bond. It was found that the Si—OH bond concentration in oxide film increases with deposition pressure, but decreases as substrate temperature is raised (X. Lin, Low temperature silicon dioxide deposition using tetramethylsilane for micro- and nanofabrication applications. PhD thesis, The Pennsylvania State University, University Park, 2000). Consequently, oxide films become less dense when deposited at high deposition pressure or low substrate temperature. From the deposition mechanism point of view, this is due to changes in the relative contribution of ion-induced deposition, average ion flux and the overall deposition rate with deposition conditions.

The stress that exists in our low deposition temperature PETMS oxide films is rather moderate. It should not raise any major functionality, manufacturability, and reliability concerns in practically any type of application in microelectronics or other areas. Moreover, for MEMs and other applications, the tunability of the stress in our films from tensile to compressive over a very narrow temperature range (i.e., from about 100° C. to 200° C.) is very unique and offers the opportunity for stress control in structures such as gauges and membranes.

Other deposition parameters, such as the reactant gas flow rates and flow rate ratio, inclusion of inert gases in the plasma, and the RF power, also play an important role in tuning the intrinsic stress in the PETMS oxide films because they can either alter the relative contribution of ion-induced deposition, ion flux and energy, overall deposition rate, or change the amount of impurities incorporation in the deposited oxide films. Therefore, they can be utilized to tailor the film stress as necessary. For example, we could adjust the TMS flow rate to reduce the hydrogen incorporation thus reduce the intrinsic tensile stress in the PETMS oxide films. Similarly, we could also increase the RF power to reduce the Si—OH bond in the PETMS oxide films, increase the film density, thus minimize the intrinsic tensile stress or even turn the intrinsic tensile stress into compressive.

The substrate can also be used to control the total stress of PETMS oxide films if the selection of substrate is not strictly limited by other technical constraints. By using a substrate with proper thermal expansion and mechanical properties, the thermal stress component can be adjusted to achieve a desired total stress in the PETMS oxide films.

Post deposition annealing can often result in changes of film composition and chemical bonding characteristic, therefore, it can change the film stress as well.

Conformality

Film conformality is another important property that has significant implications for applications, manufacturability and device reliability. Conformality is a measure of how well a film follows the microscopic topography of the substrate. We use a trench structure to demonstrate the conformality of our films and its tenability. For trenches, excellent conformality means deposited film thicknesses on the internal horizontal and vertical surfaces of the trench are the same as that on the external horizontal surface outside the trench. Excellent conformality can be highly desirable in micro- and nanofabrications, because it enables trenches to be filled without "bumps" at the top of the trench, void or seam formation. On the other hand, there are applications where bumps at the top of the trench and voids in the trench are desirable such as in forming low dielectric constant structures.

Figure 5:
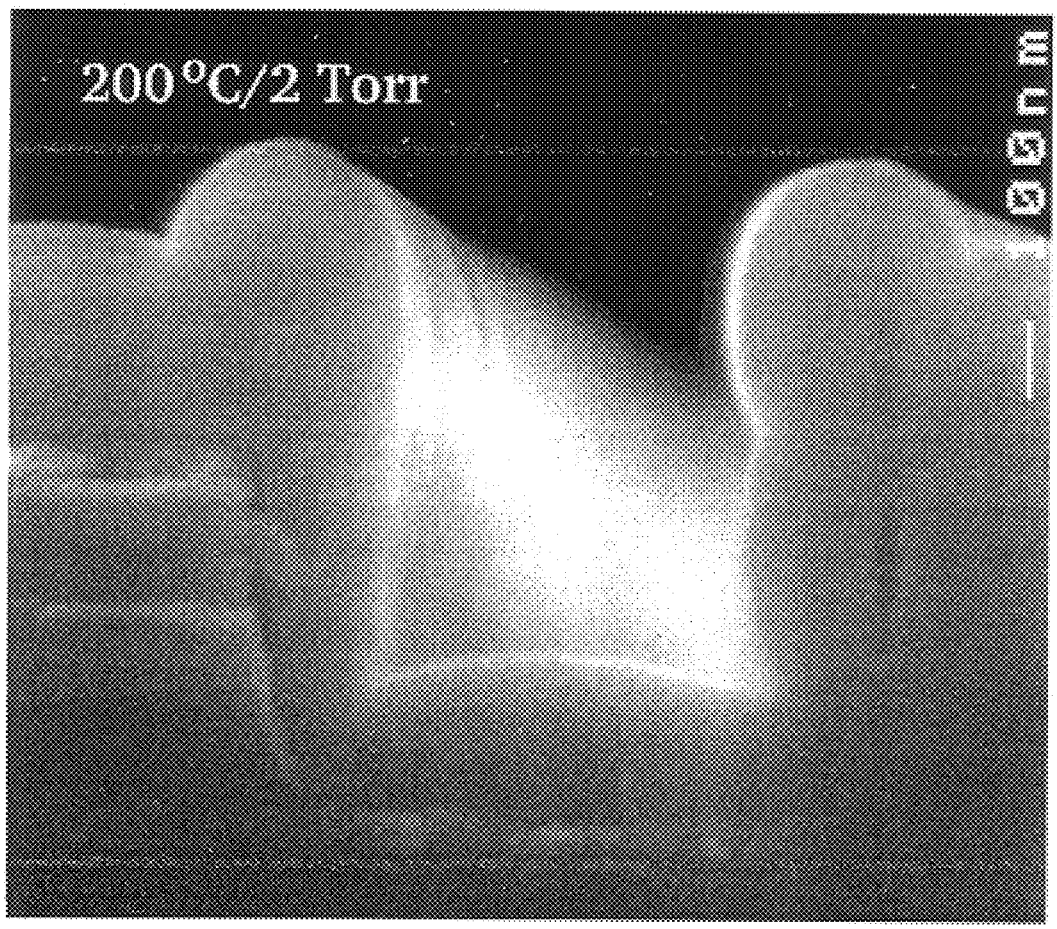
FIG. 5 is a scanning electron micrograph of a trench filled with PECVD TMS oxide deposited at 200° C., 2 Torr, 40 W with TMS: O$_2$ flow rates of 1 sccm: 500 sccm.

The evaluation of conformality was mainly done with cross-sectional SEM. PETMS oxide films were deposited onto substrates with pre-defined trenches. Prior to oxide deposition, the trench was coated with 500 Å evaporated aluminum film to allow visual differentiation between the deposited oxide and underlying trench under a scanning electron microscope. FIG. 5 shows a representative cross-sectional scanning electron micrograph of a trench filled with PETMS oxide deposited at 200° C., 2 Torr, 40 W with TMS:O$_2$ flow rates of 1 sccm:500 sccm. The aspect ratio of the trench employed to demonstrate the conformality of PETMS oxide films is approximately 0.5 with a trench width of about 0.8 µm. As clearly shown on the scanning electron micrograph in FIG. 5, the oxide film on the external surface near the feature is thicker than that on the side walls and on the bottom of the trench. Meanwhile, film thickness on the trench side walls gradually decreases from the top to the bottom. In addition, thick cusps are present at the trench corners. We have learned that these cusps can be turned into "bumps" when that structure is desired by adjusting the deposition parameters and these "bumps" can be used to close-over the trench, when desired.

The conformality varies significantly with the deposition conditions, and can be understood by considering the deposition mechanisms. Oxide deposition takes place through both atom-induced and ion-induced pathways. Atomic oxygen O. and positive oxygen ion $O_2^+$ are the primary oxygen species that contribute to the atom-induced and ion-induced depositions, respectively. O. has a very small reactive sticking coefficient in the order of $10^{-3}$ to $10^{-2}$ (J. C. Greaves and J. W. Linnett, "Recombination of atoms at surfaces: Part 6: recombination of oxygen atoms on silica from 20° C. to 600° C.," Trans. Faraday Soc., vol.55, pp. 1355–1361, 1959, M. Virmani, D. Levedakis, G. Raupp, and T. Cale, "Feature scale simulation studies of TEOS-sourced remote microwave plasma-enhanced chemical vapor deposition of silicon dioxide: Role of oxygen atom recombination," J. Vac. Sci. Technol. A, vol. 14, no. 3, pp. 977–983, 1996) and is not affected by the plasma sheath due to its charge neutrality, thus, atom-induced deposition might be nearly isotropic and have good conformality. In contrast to O, $O_2^+$ is believed to have a much higher reactive sticking coefficient and is also accelerated by the sheath voltage towards the oxide surface. Therefore, compared with the atom-induced pathway, ion-induced deposition is much more directional and tends to be non-conformal on topographical features such as in trenches.

Ion-induced deposition plays a significant role at 200° C. and 2 Torr. Therefore, the relatively poor conformality shown in FIG. 5 is partly attributed to ion-induced deposition. The formation of thick cusps at the top corners of the trench indicates that the deposition rate at the top corners of the trench is higher than at the external surface of the trench. The enhanced deposition at the top corners could be due to re-emission of active oxygen species from the side walls near the trench top. When an $O_2^+$ impinges on the trench side walls, besides reacting with absorbed TMS species to form oxide film, it could be recombined with an electron and be re-emitted into the gas phase. When it arrives at the trench corner on the opposite side of the trench, it can then react with absorbed TMS species, resulting in enhanced deposition and thick cusps at the top corners. As deposition continued, the trench would eventually be closed up at the top, leaving a void in the trench. This is generally not desirable because subsequent processes in microelectronic fabrication could potentially open up the void which could then trap poly-silicon or metal residues and cause device failure. On the other hand, however, if the void is well below the trench top surface such that it will not be opened up by subsequent process steps, it could potentially be utilized to reduce the effective dielectric constant of the insulator. When used as inter-level dielectrics in integrated circuits, it can reduce the parasitic capacitance between metal lines thus improve the circuit speed owing to reduced RC (resistance-capacitance) delay. In addition, such void formation may be utilized to create cavities in MEMs and other applications.

Figure 6:
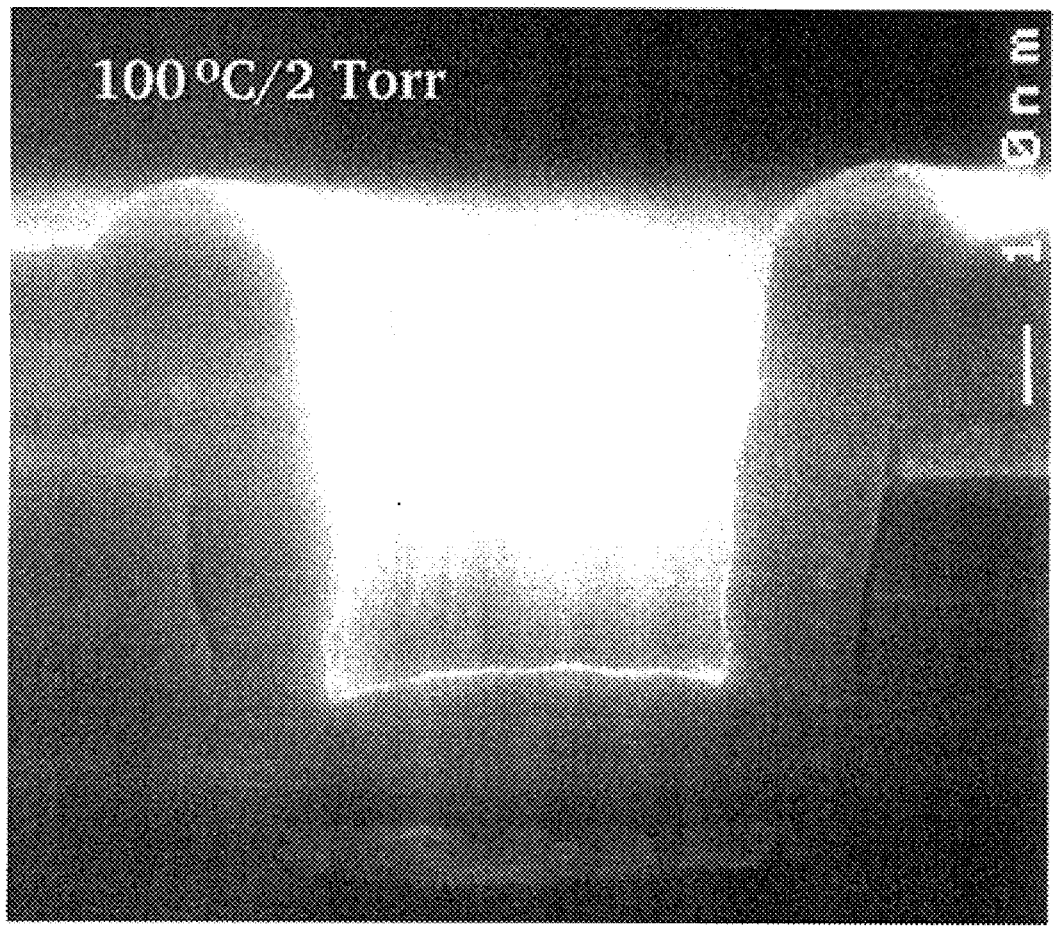
FIG. 6 is a scanning electron micrograph of a trench filled with PECVD TMS oxide deposited at 100° C., 2 Torr, 40 W with TMS:O$_2$ flow rates of 1 sccm: 500 sccm.

The conformality of PETMS oxide films can be tailored by changing the deposition conditions. FIG. 6 shows the cross-sectional scanning electron micrograph of a trench filled with PETMS oxide deposited at 100° C., 2 Torr, 40 W with TMS:$O_2$ flow rates of 1 sccm:500 sccm, which shows the following improvements of conformality over FIG. 5: (1) the oxide thickness difference between the external and internal surfaces of the trench becomes smaller, (2) the variation of oxide thickness along the trench side walls is not as significant as that shown in FIG. 5, (3) the cusps at the top corners of the trench become smaller. When the substrate temperature drops from 200° C. to 100° C., the relative contribution of atom-induced deposition increases, even though the overall deposition rate might show only very little change. Thus, the conformality of oxide film improves. Meanwhile, the conformality of atom-induced deposition is believed to be influenced by the substrate temperature as well (G. B. Raupp, D. A. Levedakis, and T. S. Cale, "Conformality of $SiO_2$ films from tetraethoxysilane-sourced remote microwave plasma-enhanced chemical vapor deposition," J. Vac. Sci. Technol. A, vol. 13, no. 3, pp. 676–680, 1995) Since the oxygen atom surface recombination consumes reactive oxygen atoms, when the recombination rate decreases with the substrate temperature, the gradients in oxygen atom flux in the trench also decrease, leading to a more conformal deposition.

Figure 7:
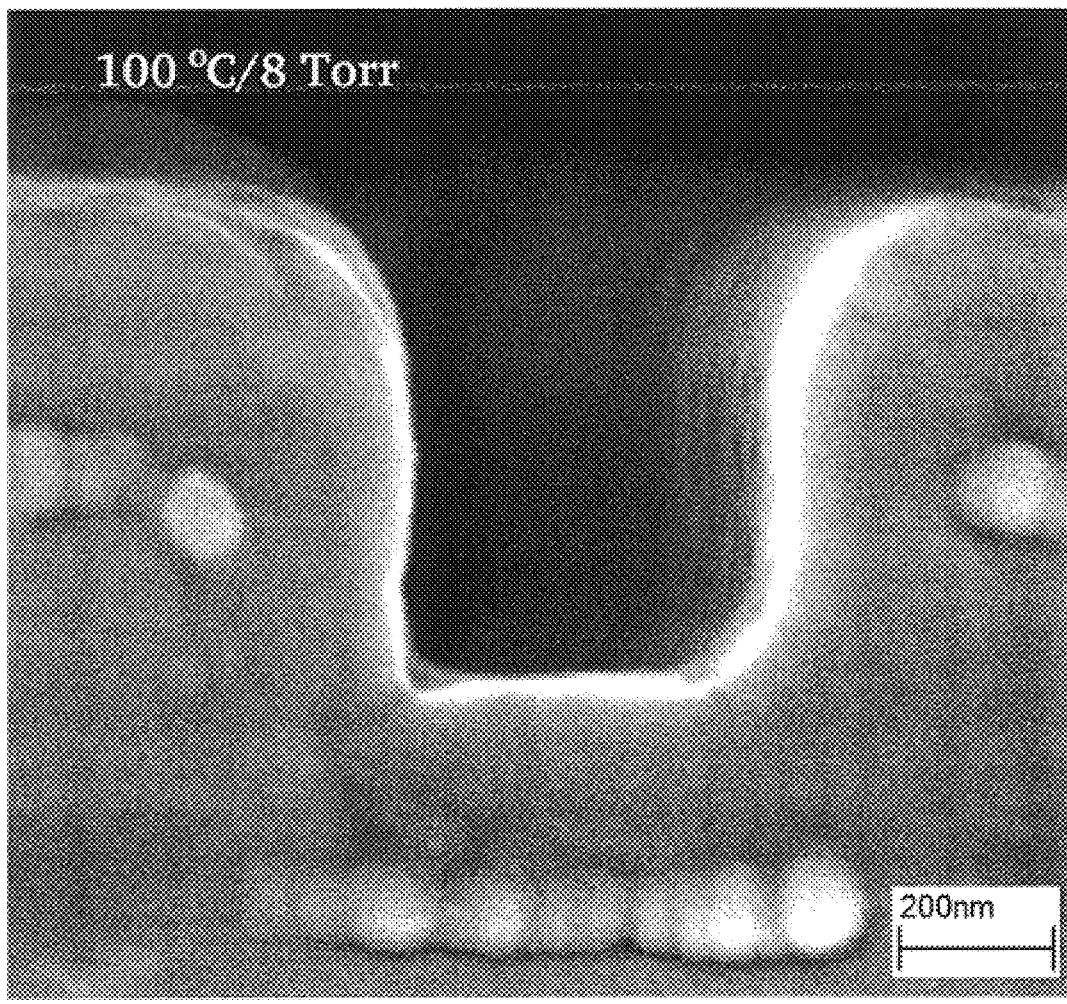
FIG. 7 is a scanning electron micrograph of a trench filled with PECVD TMS oxide deposited at 100° C., 8 Torr, 40 W with TMS:O$_2$ flow rates of 1 sccm: 500 sccm.

In addition to lowering the substrate temperature, the conformality of PETMS oxide films can be improved by increasing the deposition pressure as well. This is because that the relative contribution of atom-induced deposition increases with deposition pressure. A cross-sectional scanning electron micrograph of a trench filled with PETMS oxide deposited at 100° C., 8 Torr, 40 W with TMS:$O_2$ flow rates of 1 sccm:500 sccm is shown in FIG. 7. It can be seen from this figure that, under these deposition conditions, the cusps at the trench top corners practically disappear. In addition, the difference between the oxide thickness on the external and internal surfaces of the trench becomes smaller as well. Even though oxide on the trench side walls is still thinner than that on the trench external and bottom surfaces, its change along the trench side walls is drastically reduced.

The excellent conformality achieved at 100° C. and 8 Torr as demonstrated in this application indicates that TMS is a promising candidate as a silicon precursor for low temperature inter-level dielectric deposition.

Post-Deposition Annealing Treatment

The electrical properties of PETMS oxide can be greatly improved by a post-deposition annealing treatment. Typically, such annealing step is carried out at a temperature higher than the deposition temperature to achieve the maximum benefit of the annealing treatment, which unfortunately is not compatible with low temperature process. Therefore, in order to preserve the low temperature aspect of the PETMS oxide films, in this invention, annealing was carried out at the deposition temperatures in forming gas. For comparison, annealing was also performed in Ar ambient. It should be pointed out that annealing could be performed below the deposition temperature as well. However, a higher annealing temperature typically provide better results. This invention is intended to cover all the cases where post-deposition annealing improves the properties of the deposited films without compromising the low temperature aspect of the deposition process.

Figure 8A:
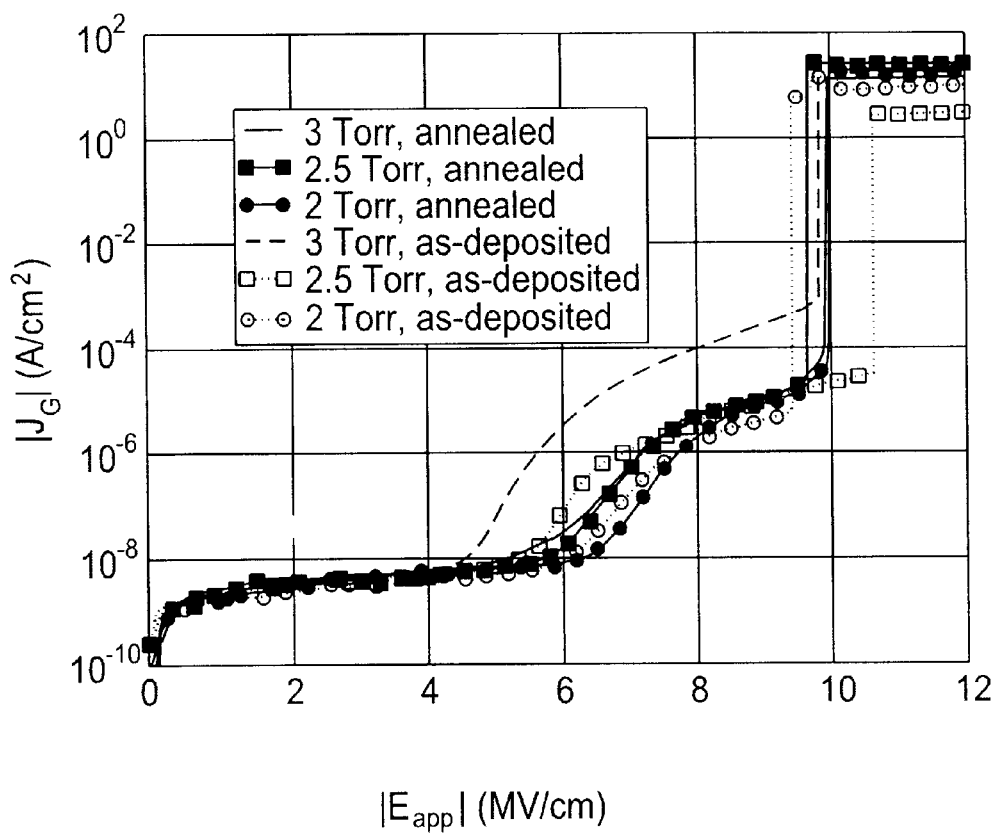
FIG. 8 is I-V characteristic of as-deposited and annealed PETMS oxides deposited at 200° C., 40 W with TMS:O$_2$ flow rates of 1 sccm: 500 sccm. (a) Current density vs. applied electric field; (b) Fowler-Nordheim plot. The values in parentheses on the Fowler-Nordheim plot are barrier heights calculated from the slopes of the linear portions of the corresponding curves.
Figure 8B:
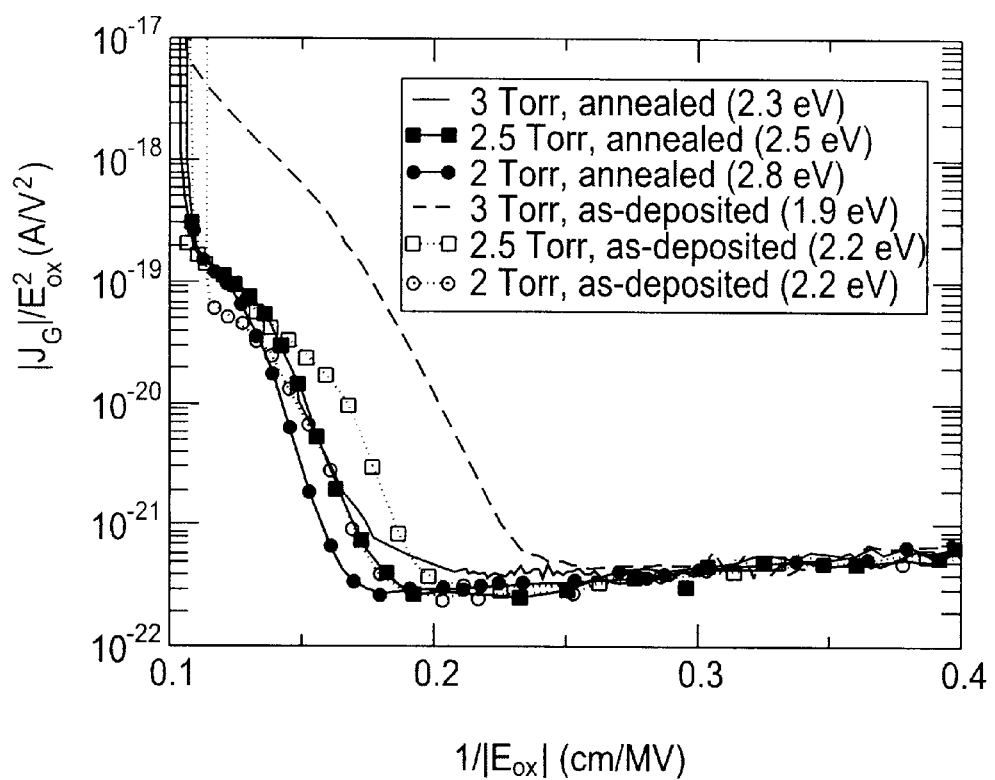

FIG. 8 shows the I-V characteristic of oxide films deposited at 200° C. and annealed at the same temperature in forming gas for two hours. The I-V characteristic of as-deposited films are also included in the figure for comparison. FIG. 8(a) illustrates the relationship between the gate current density and the applied electric field, and FIG. 8(b) is the corresponding Fowler-Nordheim plot. The electric field corresponding to the onset of F-N tunneling increases after the annealing treatment for all oxide films. The increase is more significant for the oxide films deposited at 3 Torr which exhibited a relatively poor I-V characteristic before annealing. In addition, the F-N tunneling barrier height has increased dramatically after annealing, from 2.2 eV, 2.2 eV, and 1.9 eV to 2.8 eV, 2.5 eV, and 2.3 eV, respectively, for oxide films deposited at 2 Torr, 2.5 Torr, and 3 Torr, respectively.

Figure 9A:
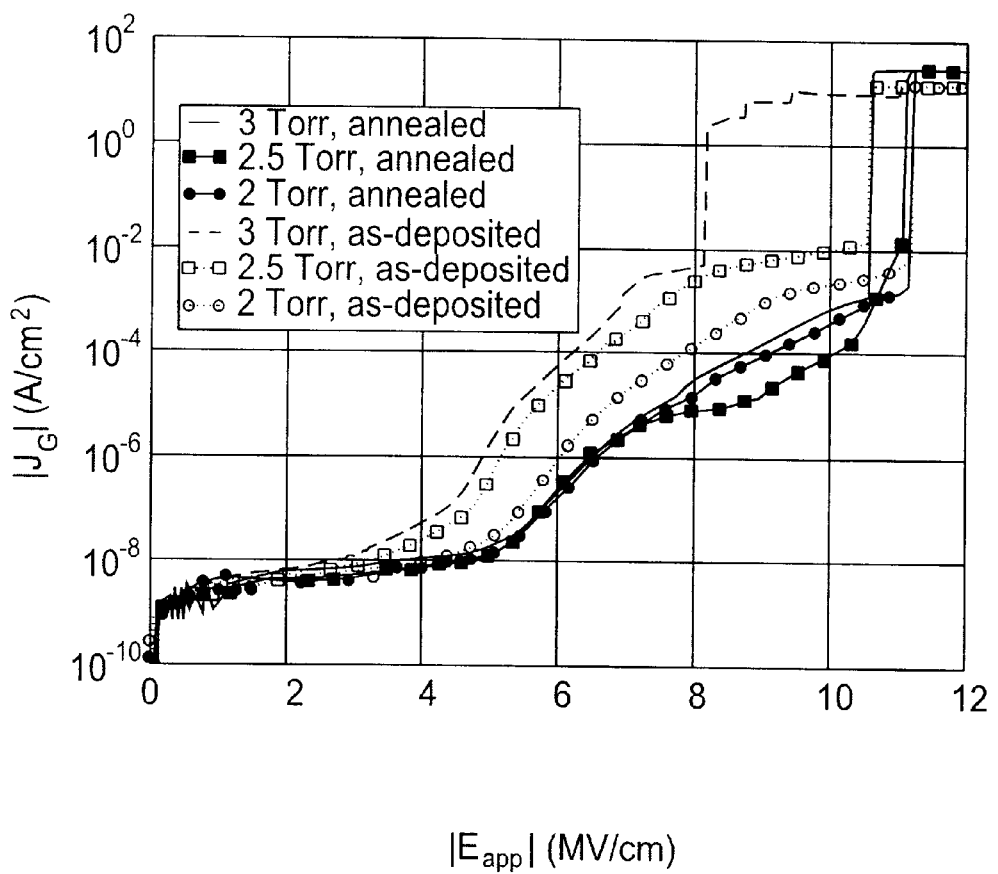
FIG. 9 is I-V characteristic of as-deposited and annealed PETMS oxides deposited at 150° C., 40 W with TMS:O$_2$ flow rates of 1 sccm: 500 sccm. (a) Current density vs. applied electric field; (b) Fowler-Nordheim plot. The values in parentheses on the Fowler-Nordheim plot are barrier heights calculated from the slopes of the linear portions of the corresponding curves.
Figure 9B:
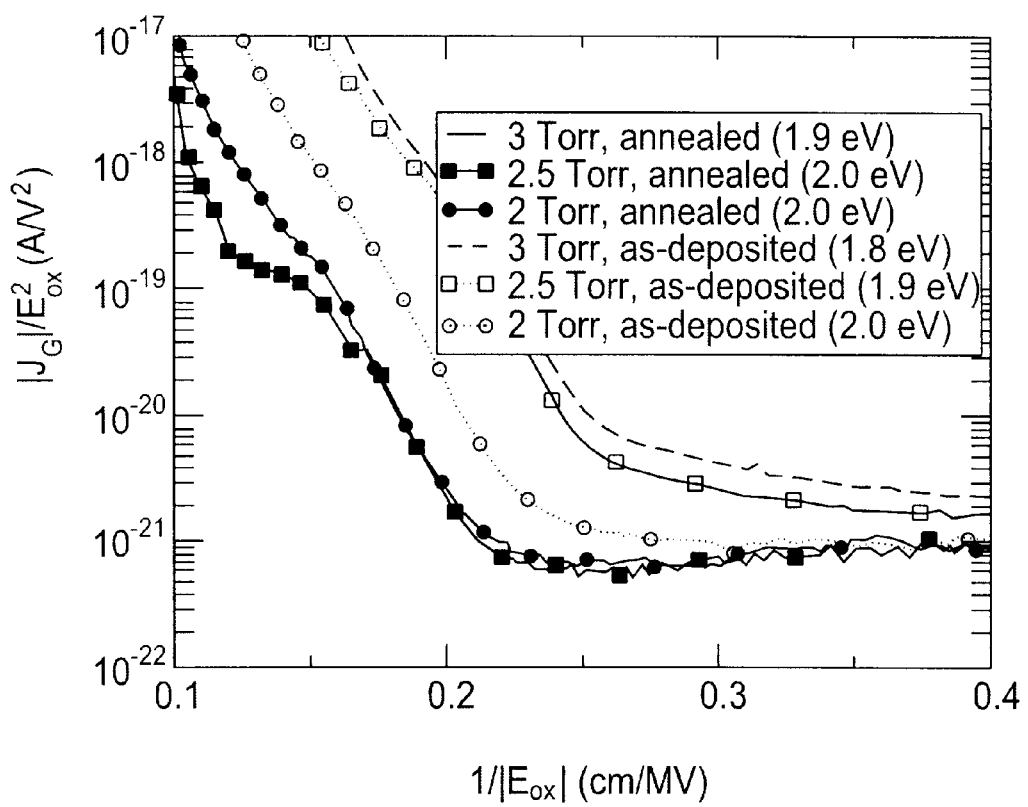

For the PETMS oxide films deposited at 150° C., similar effects of annealing were observed from FIG. 9. However, the change in the F-N tunneling onset electric field after forming gas annealing is larger than those shown in FIG. 8. In contrast, the F-N tunneling barrier height after annealing increases by only 0.1 eV for the oxide films deposited at 2.5 Torr and 3 Torr, and remains unchanged at 2.0 eV for the oxide film deposited at 2 Torr.

Post-deposition annealing at the deposition temperature in forming gas resulted in no significant change in the I-V characteristic of the oxide films deposited at 100° C. Clearly, oxide films deposited and annealed at higher temperatures exhibit more significant improvement of the I-V characteristic after forming gas annealing. Therefore, post-deposition annealing is more effective at higher temperatures.

Besides the improvement in the I-V characteristics, post-deposition annealing treatment also led to a better C-V characteristic of the deposited films. As an example, a comparison of the high frequency C-V characteristic between as-deposited and annealed PETMS oxide films deposited at 150° C. is given in FIG. 10. After the annealing treatment, the flat band voltage shifts towards the positive direction. The hysteresis in the C-V characteristic is also reduced.

Figure 10:
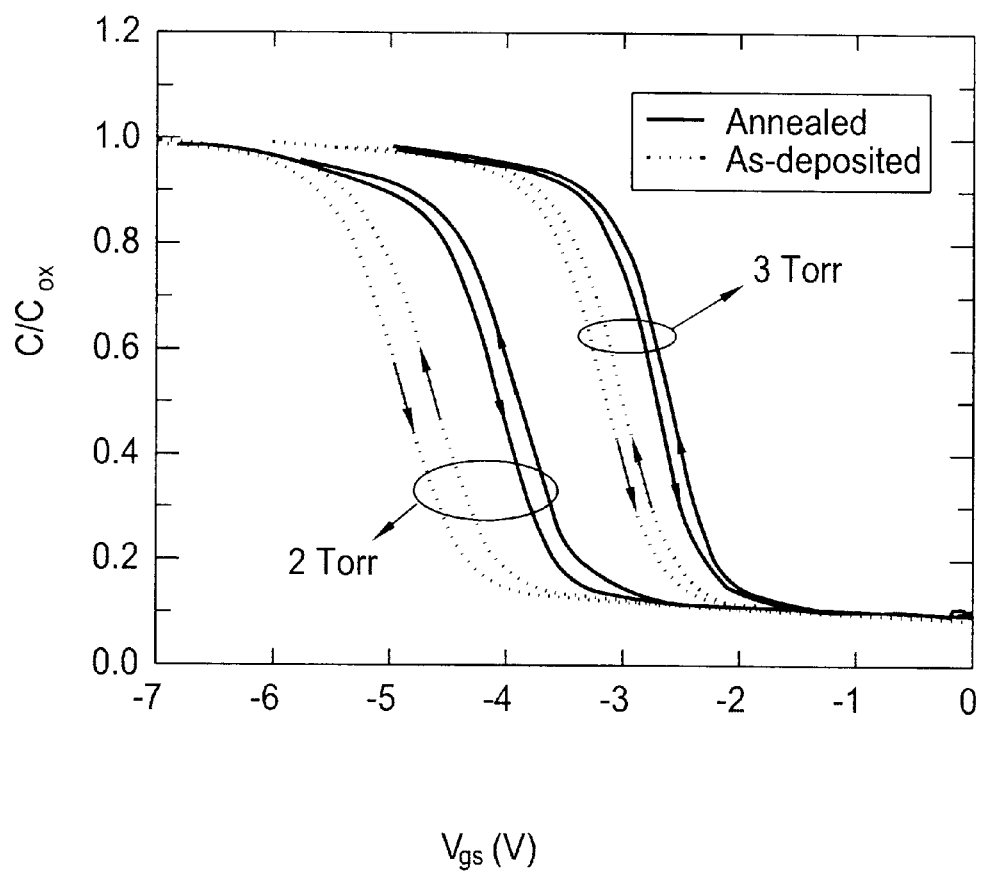
FIG. 10 is high frequency C-V characteristic of as-deposited and annealed PETMS oxides deposited at 150° C., 40 W with TMS:O$_2$ flow rates of 1 sccm: 500 sccm. The arrows indicate the directions of $V_G$ sweep. Measurement was performed from depletion to accumulation, then back to depletion.
Figure 11:
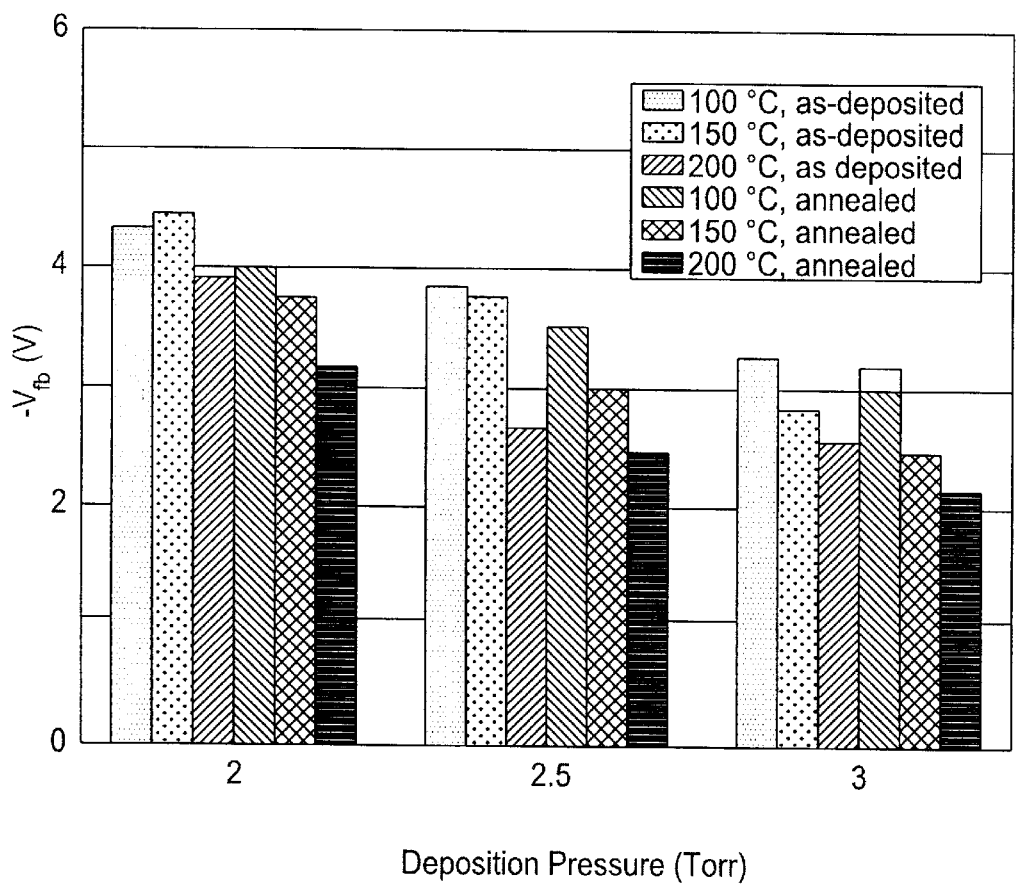
FIG. 11 is a comparison of $V_{fb}$ between as-deposited and annealed PETMS oxides deposited at different pressures and temperatures.

The effects of annealing observed in FIG. 10 apply to oxide films deposited at different conditions as well. FIG. 11 compares the flat band voltages before and after forming gas annealing for the PETMS oxide films deposited at various pressures and substrate temperatures. All the oxide films show a reduction in the negative flat band voltage after annealing. Similar to the I-V characteristics, a more significant improvement was observed in the C-V characteristics of the oxide films deposited at 200° C. and 150° C. than in those deposited at 100° C. On the other hand, however, the oxide films deposited at 3 Torr, which have a relatively smaller negative $V_{fb}$ before annealing, exhibit smaller $V_{fb}$ shifts than those deposited at 2 Torr and 2.5 Torr. Generally speaking, the trends of variation in flat band voltage with respect to the pressure and temperature are the same for both as-deposited and annealed oxide films.

Figure 12:
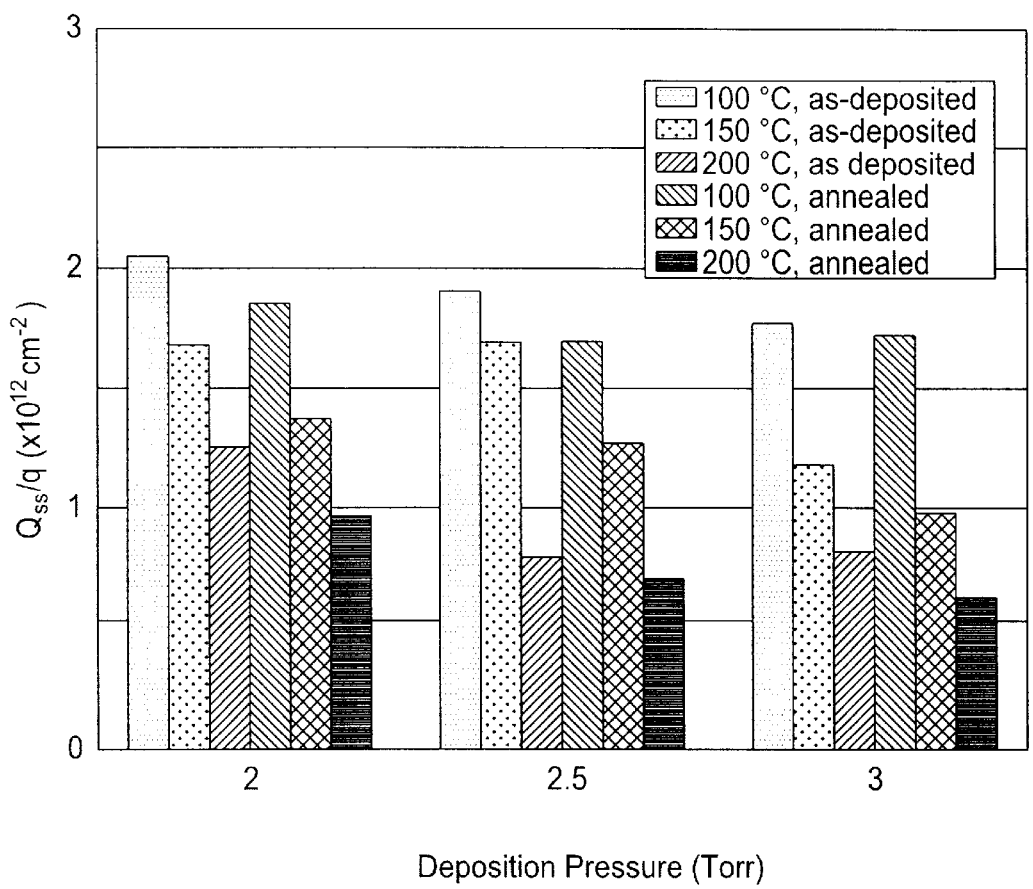
FIG. 12 is a comparison of $Q_{ss}/q$ between as-deposited and annealed PETMS oxides deposited at different pressures and temperatures.

The positive flat band voltage shift resulting from forming gas annealing corresponds to a reduction in positive trapped charges in the oxide. The oxide charge numbers $Q_{ss}/q$ for both as-deposited and annealed films deposited at different pressures and temperatures are compared in FIG. 12, which shows similar trends to those observed in FIG. 11.

Figure 13:
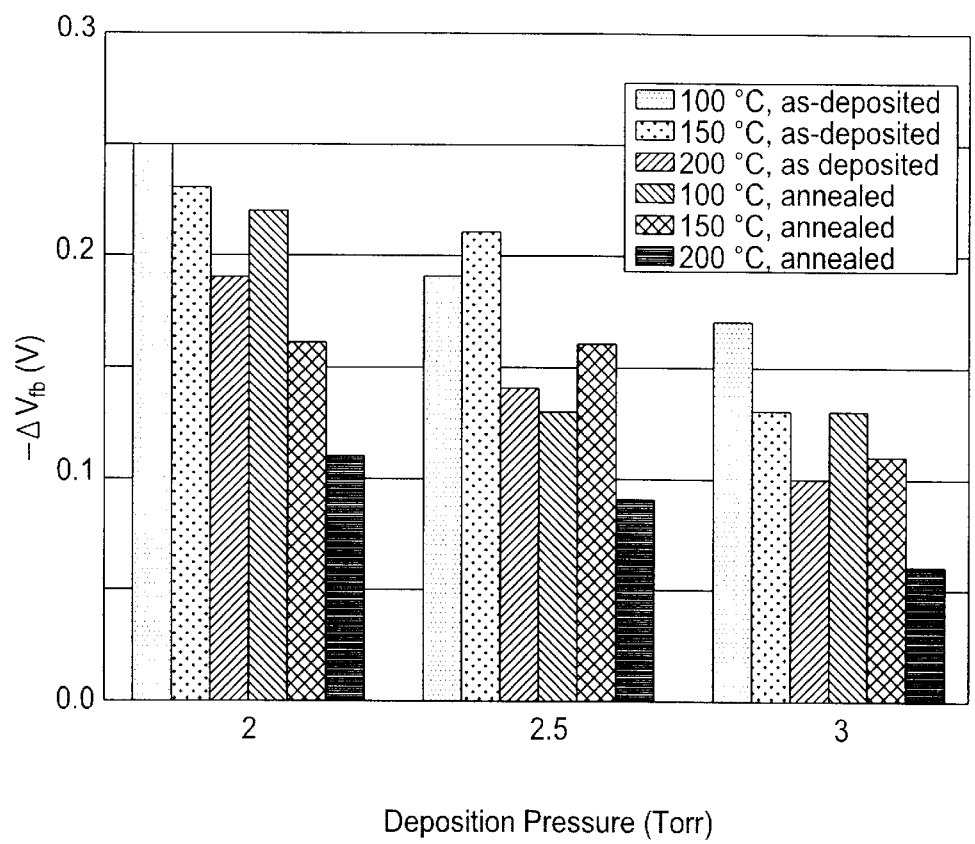
FIG. 13 is a comparison of $\Delta V_{fb}$ between as-deposited and annealed PETMS oxides deposited at different pressures and temperatures. $\Delta V_{fb}$ is a measure of the hysteresis.

FIG. 13 plots the hysteresis of both as-deposited and annealed oxide films prepared under different pressures and temperatures. A reduction of hysteresis by the annealing treatment is clearly seen for every sample, which indicates that either less positive charges were injected into the annealed oxide or less electrons were released from the oxide during the C-V sweep. The overall trends of variations in the hysteresis with respect to the temperature and pressure are similar to those observed in FIG. 11 and FIG. 12, except that the oxide films deposited at 100° C. also show a noticeable reduction in hysteresis.

Figure 14:
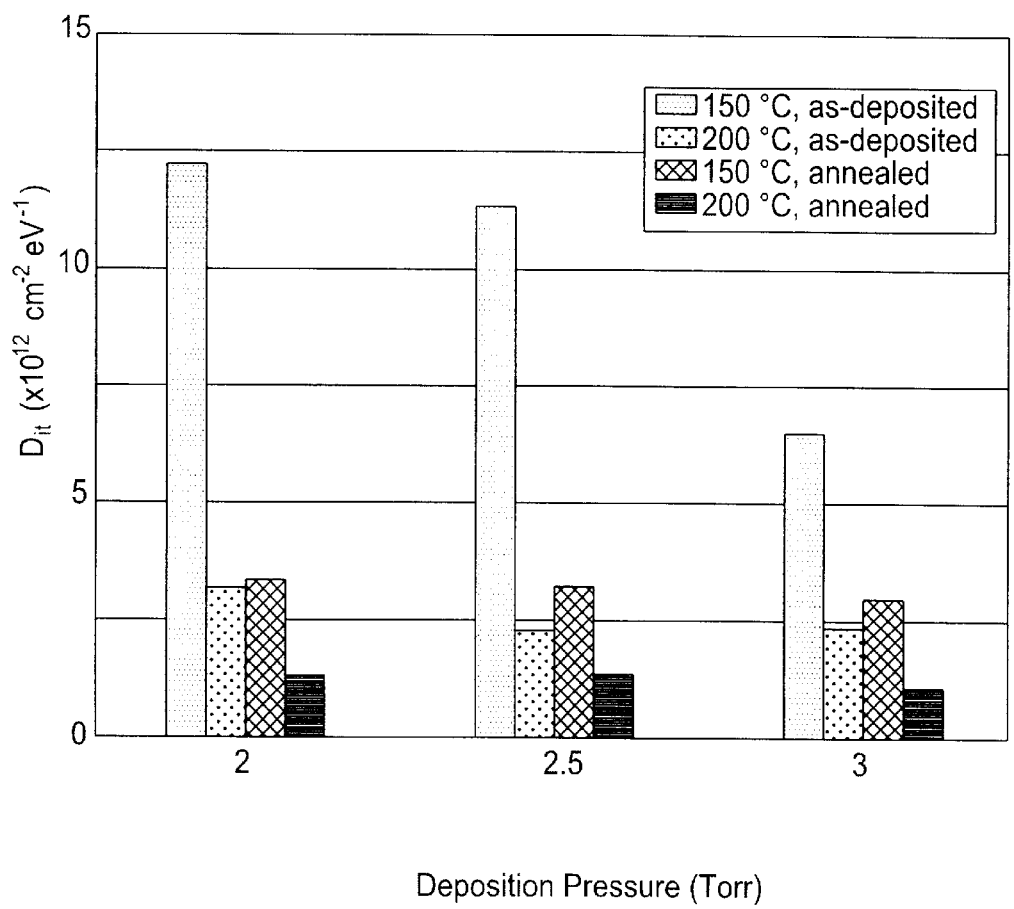
FIG. 14 is a comparison of $D_{it}$ between as-deposited and annealed PETMS oxides deposited at different pressures and temperatures.

FIG. 14 compares the interface state densities before and after forming gas annealing. It clearly shows that forming gas annealing resulted in a significant reduction in interface state. The majority of interface states appear to be passivated by the annealing treatment.

FTIR spectra and dielectric constant were measured to reveal the chemical, structural, and compositional changes due to annealing treatment. It was found that structural and compositional changes resulting from annealing were rather small and were below the FTIR detection limit. However, a small change of up to 6% in the dielectric constant was observed.

Annealing at deposition temperatures in argon ambient provided no improvement in either the I-V or C-V characteristics of the PETMS oxide films, which suggests that hydrogen is playing a key role in the annealing process.

The improvement of electrical properties was attributed to the passivation of silicon dangling bonds and damages at the $Si/SiO_2$ interface by hydrogen and removal of Si—OH bonds from the oxide during annealing treatment in forming gas.

Post-deposition annealing in forming gas at the deposition temperatures proved to be an effective method to improve the electrical properties of the deposited oxide films and at the same time preserve the low temperature aspect of the process.

It should be understood that the foregoing description is only illustrative of the invention. Various alternatives and modifications can be devised by those skilled in the art without departing from the invention. Accordingly, the present invention is intended to embrace all alternatives, modifications and variances.

What is claimed is:

1. A method for forming a silicon dioxide film on a substrate comprising the steps of:
    (a) heating said substrate to a deposition temperature of between about 25° C. to 250° C.;
    (b) providing tetramethylsilane (TMS) in a gas flow amount up to about 1,000 sccm, and an oxygen containing gas in a plasma discharge;
    (c) developing pressure between about 0.001 Torr and 100 Torr; and
    (d) depositing $SiO_2$ on said substrate.

2. The method as recited in claim 1, wherein said substrate comprises at least one of: a semiconductor, a dielectric, a conductor, a glass, a polymer, a plastic, a metal foil or combinations thereof.

3. The method as recited in claim 1, wherein said deposition temperature is from about 100° C. to 200° C. and said pressure of step (c) is between about 2 Torr to about 8 Torr.

4. The method as recited in claim 1, wherein said TMS is provided in a gas flow amount up to about 100 sccm in said plasma discharge.

5. The method as recited in claim 1, wherein said plasma discharge comprises oxygen atoms, radicals and ions.

6. The method as recited in claim 1, wherein said TMS to oxygen flow rate ratio is between about 1:10 to about 1:2000.

7. The method as recited in claim 1, further comprising the step of providing RF power of between about 1 W to 1000 W.

8. The method as recited in claim 1, further comprising a post-deposition annealing step which comprises applying a forming gas and heating said silicon dioxide film to an annealing temperature at or below said deposition temperature of step (a).

9. The method as recited in claim 8, wherein said forming gas comprises hydrogen and a gas selected from the group consisting of: argon, nitrogen, helium and mixtures thereof.

10. The method as recited in claim 8, wherein the leakage current through said silicon dioxide film is reduced while said annealing temperature of said silicon dioxide film is maintained at or below said deposition temperature of step (a).

11. The method as recited in claim 8, wherein the interface trap state density of said silicon dioxide film is reduced while said annealing temperature of said silicon dioxide film is maintained at or below said deposition temperature of step (a).

12. The method as recited in claim 8, wherein the oxide charge density in said silicon oxide film is reduced while said annealing temperature of said silicon dioxide film is maintained at or below said deposition temperature of step (a).

13. The method as recited in claim 8, wherein the amount of trapped charges in said dioxide film as demonstrated by bi-directional dynamic capacitance-voltage (C-V) sweep is reduced while said annealing temperature of said silicon dioxide film is maintained at or below said deposition temperature of step (a).

14. The method as recited in claim 1, further comprising the step of providing RF power from about 1 W to about 1000 W.

15. The method as recited in claim 14 wherein the conformality of said silicon dioxide film is adjusted during deposition by varying at least one condition selected from the group consisting of: TMS flow rate, $TMS:O_2$ flow rate ratio, RF power, temperature, substrates material and film thickness.

16. The method as recited in claim 15, wherein said silicon dioxide film exhibits bumps, voids or combinations thereof.

17. The method as recited in claim 1, further comprising at least one step effected during deposition of said silicon dioxide from the group consisting of: decreasing the deposition temperature of step (a) to less than about 200° C. but not below about 25° C. and increasing the pressure of step (c) to above about 3 Torr but not greater than abut 100 Torr wherein said silicon dioxide film exhibits conformal deposition topology on said substrate.

18. The method as recited in claim 17, wherein said deposition temperature is between about 25° C. to 200° C. and said pressure is between about 5 Torr and 100 Torr.

19. The method as recited in claim 1, further comprising at least one step from the group consisting of: increasing the deposition temperature of step (a) to at least about 50° C. but not above about 250° C. and decreasing the pressure of step (c) to below about 10 Torr but not below about 0.001 Torr wherein said silicon dioxide film exhibits non-conformal deposition topology having a void or a seam disposed between said film and substrate or within said film.

20. The method as recited in claim 19, wherein said deposition temperature is between about 50° C. to about 250° C. and said pressure is below about 8 Torr.

21. A method for controlling during deposition the stress level of a silicon dioxide film which is formed on a substrates comprising the steps of:
    (a) heating said substrate to a deposition temperature of between about 25° C. to 250° C.;
    (b) providing TMS in a gas flow amount up to about 1,000 sccm, and an oxygen containing gas in a plasma discharge;
    (c) developing a pressure between about 0.001 Torr and 100 Torr; and
    (d) depositing $SiO_2$ on said substrate, wherein said silicon dioxide film exhibits a stress level between about −1.0 GPa to 0.5 GPa.

22. The method as recited in claim 21, wherein said silicon dioxide film exhibits a stress level between about −0.5 GPa to 12 GPa.

23. The method as recited in claim 21, further comprising at least one step during deposition of said silicon dioxide from the group consisting of: decreasing the deposition temperature of step (a) to not less than about 25° C. and increasing the pressure of step (c) to not more than about 100 Torr wherein said silicon dioxide film exhibits tensile stress between about 0 GPa to about 0.5 GPa.

24. The method as recited in claim 21, further comprising at least one step during deposition of said silicon dioxide from the group consisting of: increasing the deposition temperature of step (a) to not more than about 250° C. and decreasing the pressure of step (c) to not less than about 0.001 Torr wherein said silicon dioxide film exhibits compressive stress between about −1.0 GPa to about 0 GPa.

25. The method as recited in claim 21, further comprising the providing of RF power from about 1 W to about 1000 W.

26. The method as recited in claim 25 wherein the stress of said silicon dioxide film is adjusted during deposition by varying at least one condition selected from the group consisting of: TMS flow rate, TMS:$0_2$ flow rate ratio, RF power, temperature, deposition pressure, substrate material and film thickness.

27. The method as recited in claim 26, wherein said silicon dioxide film exhibits zero stress of 0 GPa.

* * * * *